United States Patent

Blair

[11] Patent Number: 5,904,536
[45] Date of Patent: May 18, 1999

[54] SELF ALIGNED POLY EMITTER BIPOLAR TECHNOLOGY USING DAMASCENE TECHNIQUE

[75] Inventor: Christopher S. Blair, San Jose, Calif.

[73] Assignee: National Semiconductor Corporation, Santa Clara, Calif.

[21] Appl. No.: 09/071,241

[22] Filed: May 1, 1998

[51] Int. Cl.⁶ .................................................. H01L 21/331
[52] U.S. Cl. .......................... 438/366; 438/369; 438/370; 438/561; 438/564; 438/657; 438/659; 438/700; 148/DIG. 10; 148/DIG. 11
[58] Field of Search .................................... 438/365, 309, 438/366, 369, 370, 564, 561, 700, 657, 659, FOR 165, FOR 206, FOR 322, FOR 351, FOR 465; 148/DIG. 10, DIG. 11

[56] References Cited

U.S. PATENT DOCUMENTS

| | | | |
|---|---|---|---|
| 3,664,896 | 5/1972 | Duncan | 438/370 |
| 4,662,062 | 5/1987 | Toyooka et al. | 438/370 |
| 4,710,241 | 12/1987 | Komatsu | 438/369 |
| 4,745,087 | 5/1988 | Iranmanesh | 438/365 |
| 5,055,419 | 10/1991 | Scovell et al. | 148/DIG. 10 |
| 5,242,858 | 9/1993 | Sakamoto et al. | 438/365 |
| 5,420,051 | 5/1995 | Bohr et al. | 438/365 |
| 5,444,004 | 8/1995 | Jang | 148/DIG. 10 |
| 5,476,799 | 12/1995 | Sakamoto et al. | 438/370 |
| 5,494,848 | 2/1996 | Chin | 438/456 |
| 5,580,798 | 12/1996 | Grubisich | 148/DIG. 10 |
| 5,643,809 | 7/1997 | Lien | 148/DIG. 10 |
| 5,698,459 | 12/1997 | Grubisich et al. | 438/370 |
| 5,731,240 | 3/1998 | Kataoka | 438/365 |

FOREIGN PATENT DOCUMENTS

| | | | |
|---|---|---|---|
| 405090196 | 4/1993 | Japan | 438/FOR 206 |
| 406224208 | 8/1994 | Japan | 438/FOR 165 |

*Primary Examiner*—Peter Toby Brown
*Assistant Examiner*—Long Pham
*Attorney, Agent, or Firm*—Limbach & Limbach L.L.P.

[57] ABSTRACT

A polysilicon emitter of a bipolar device is formed utilizing a self-aligned Damascene technique. An oxide mask is patterned over epitaxial silicon implanted to form the intrinsic base. The oxide mask is then etched to form a window. Polysilicon is uniformly deposited over the oxide mask and into the window. The polysilicon is then polished to remove polysilicon outside of the window. Etching of the oxide mask follows, with good selectivity of oxide over silicon. This selectivity produces a polysilicon emitter atop an intrinsic base, the base flush with the silicon surface rather than recessed because of overetching associated with conventional processes.

16 Claims, 5 Drawing Sheets

SELF ALIGNED POLY EMITTER BIPOLAR TECHNOLOGY USING DAMASCENE TECHNIQUE

BACKGROUND OF THE INVENTION

1. Field of the Invention

The present invention relates to a process for forming an emitter of a bipolar transistor, and in particular, to a self-aligned process of forming a polysilicon emitter of a bipolar transistor that does not result in etching of the base upon which the emitter is formed.

2. Description of the Related Art

FIGS. 1A–1F show cross-sectional views of the conventional process steps for forming an NPN bipolar transistor having a polysilicon emitter.

FIG. 1A shows the starting point for the process. A high dose of N type dopant is implanted into silicon substrate 100 to create N+ region 102. Epitaxial silicon 101 is then grown from substrate 100 with adequate doping and thickness to meet the necessary collector requirements ($BV_{ceo}$, $BV_{cbo}$, etc.) of the particular device. Isolation structures 104 are formed using conventional techniques such as LOCOS or shallow trench isolation. Finally, sink 103 enabling electrical contact with the collector is formed by implantation of high doses of n type dopant at relatively low energy.

FIG. 1B shows the implant of p type dopant into epitaxial silicon 101 to form intrinsic base 106, followed by formation of polysilicon layer 108 on top of epitaxial silicon 101, sink 103, and isolation structures 104.

FIG. 1C shows the formation of a patterned photoresist mask 110 over the polysilicon layer 108. Photoresist mask 110 is present over the region in which the emitter will be formed.

FIG. 1D shows etching of unmasked polysilicon 108 to define polysilicon emitter structure 112. Here, the difficulty in selectively etching polysilicon versus underlying epitaxial silicon 101 causes overetching of epitaxial silicon 101. This overetching produces recesses 114 in epitaxial silicon 100 between isolation structures 104. Sink 103 is also partially degraded by this overetching.

FIG. 1E shows implant of medium level doses (typically $1 \times 10^{18}$ atoms/cm$^3$) of p type dopant into epitaxial silicon adjacent to emitter 112, forming link base 118.

FIG. 1F shows the formation of emitter spacer structures 119, followed by the implant of high level doses (typically $1 \times 10^{19} - 1 \times 10^{20}$ atoms/cm$^3$) of p type dopant into the link base 118, forming extrinsic base 121.

Fabrication of the bipolar transistor 116 is finalized by creating silicided emitter, sink, and extrinsic base contacts, and an overlying interconnect metallization structure.

The conventional process flow shown in FIGS. 1A–1F can be successfully implemented to fabricate bipolar transistors. However, the conventional process suffers from several disadvantages.

Overetching of epitaxial silicon in the base discussed above in connection with FIG. 1D occurs because no plasma etching technology has yet been discovered which is selective to polysilicon over epitaxial silicon. Thus, all conventional fabrication processes must trade off polysilicon overetch in the base with product yield.

Specifically, too little polysilicon overetch results in possible shorting between the polysilicon emitter and the link base due to the presence of residual polysilicon on top of the link base.

Too much polysilicon overetch risks degradation of device characteristics. Specifically, overetching reduces the electronic connection between the intrinsic base and the link base, resulting in excessively high overall base resistance. Overetching also results in positioning of the link and extrinsic bases closer to the underlying silicon substrate, enhancing the possibility of leakage or breakdown between base and substrate. Moreover, overetching also results in loss of a portion of the sink region.

Therefore, there is a need in the art for a process of forming a bipolar transistor structure that eliminates overetching of silicon upon which the polysilicon emitter is formed, minimizing base resistance and allowing for creation of shallow base regions.

SUMMARY OF THE INVENTION

This invention proposes a process for forming a polysilicon emitter of a bipolar transistor utilizing a Damascene technique. Rather than forming the polysilicon emitter by etching a polysilicon layer directly above the base, the present invention forms polysilicon within a window of an oxide mask above the intrinsic base. Polysilicon is then deposited over the entire oxide mask, including the window. Subsequent removal of polysilicon outside the window is accomplished by etching or polishing. The oxide mask is then removed utilizing etching chemistries having high selectivity for oxide over polysilicon. Implantation. Finally, the link and extrinsic link base regions are created, and back-end processing proceeds in the conventional fashion.

A first embodiment of the method for forming a bipolar transistor in accordance with the present invention comprises the steps of forming an oxide layer over silicon, etching the oxide layer to form a window, forming polysilicon over the oxide layer and within the window, removing polysilicon outside of the window, introducing dopant of a first conductivity type into the polysilicon, removing the oxide layer to reveal a polysilicon emitter structure, and forming a base and a collector.

The features and advantages of the present invention will be understood upon consideration of the following detailed description of the invention and the accompanying drawings.

DETAILED DESCRIPTION OF THE INVENTION

The present invention forms an extrinsic polysilicon emitter of a bipolar device utilizing a self-aligned Damascene technique. An oxide mask is patterned over silicon forming the intrinsic base. The oxide masked is then etched to form a window. Polysilicon is then deposited over the oxide mask and into the window. The polysilicon is then polished or etched to remove polysilicon outside of the window. Etching of the oxide mask follows, with good selectivity of oxide over silicon. This selectivity produces sink and extrinsic/link base structures flush with the surface of the silicon, rather than recessed as in the conventional processes.

FIGS. 2A–2J illustrate cross-sectional views of the process steps forming an NPN bipolar transistor having polysilicon emitter in accordance with a first embodiment of the present invention.

Figure 1A:
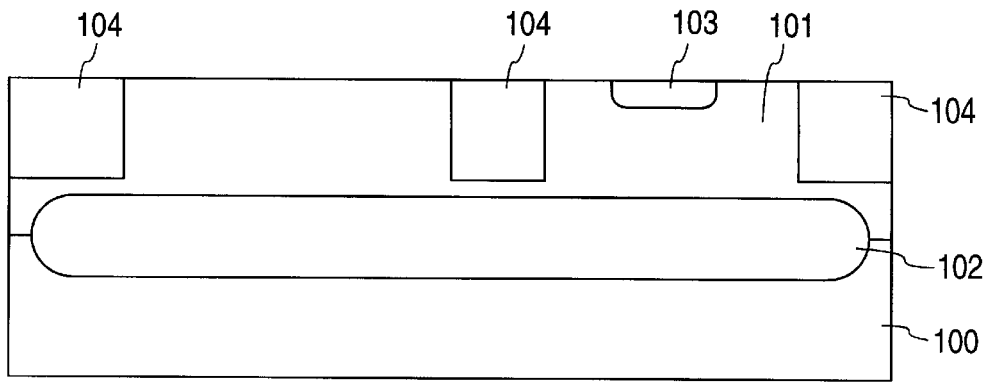
FIGS. 1A–1F illustrate cross-sectional views of conventional process steps for forming an NPN bipolar transistor having a polysilicon emitter.
Figure 1B:
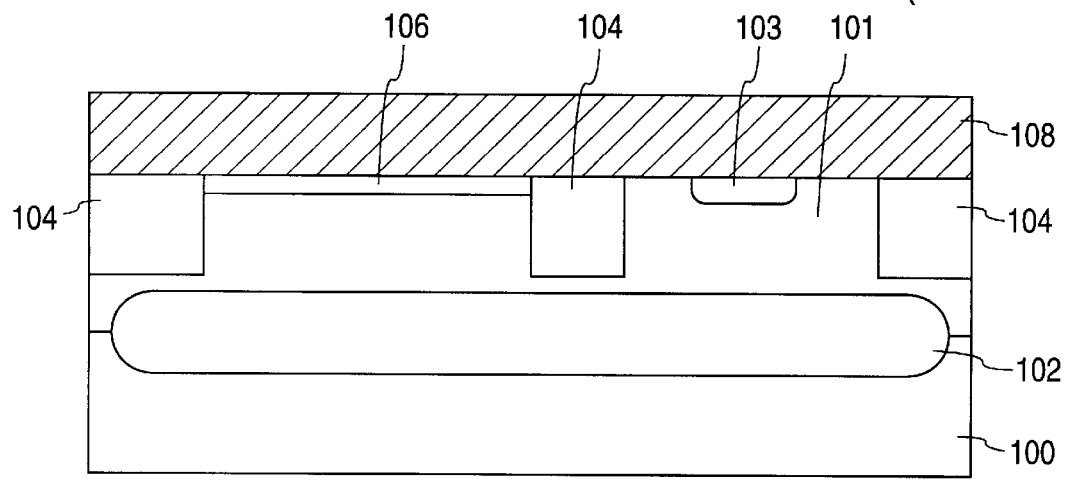
Figure 1C:
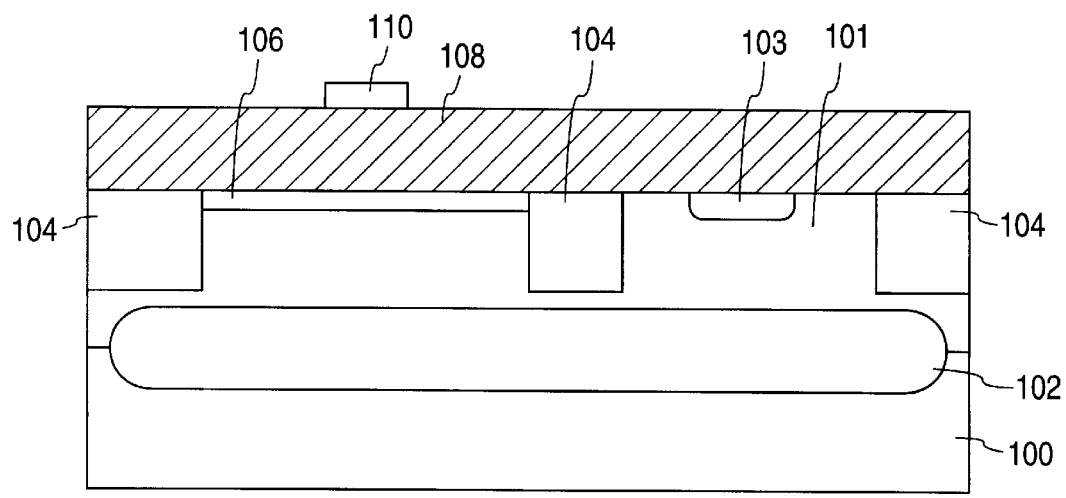
Figure 1D:
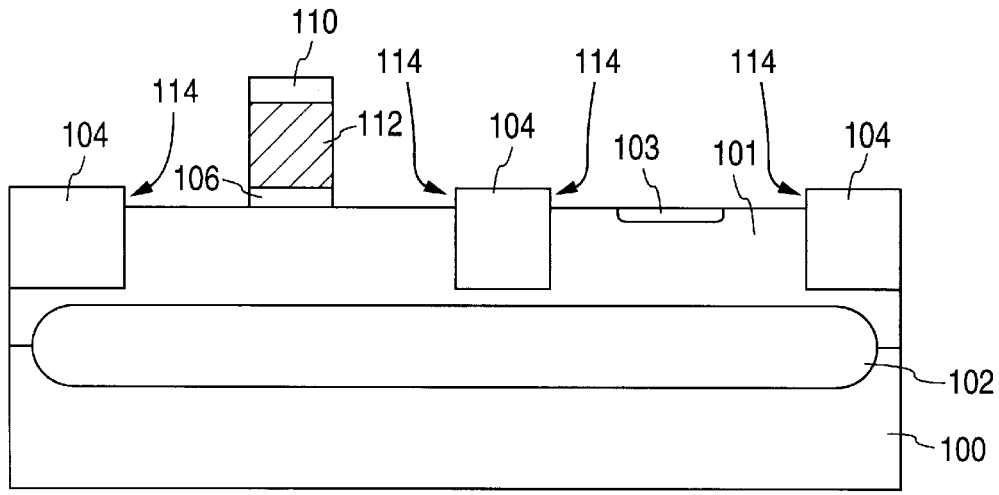
Figure 1E:
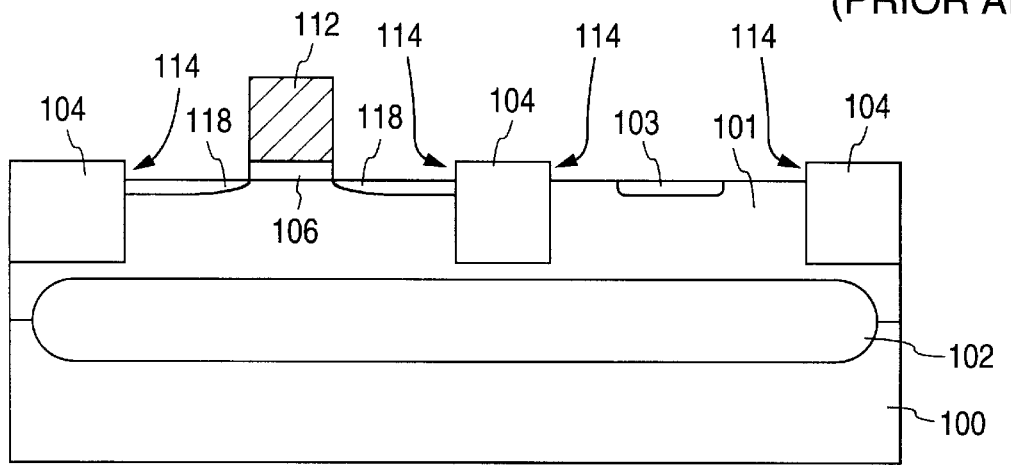
Figure 1F:
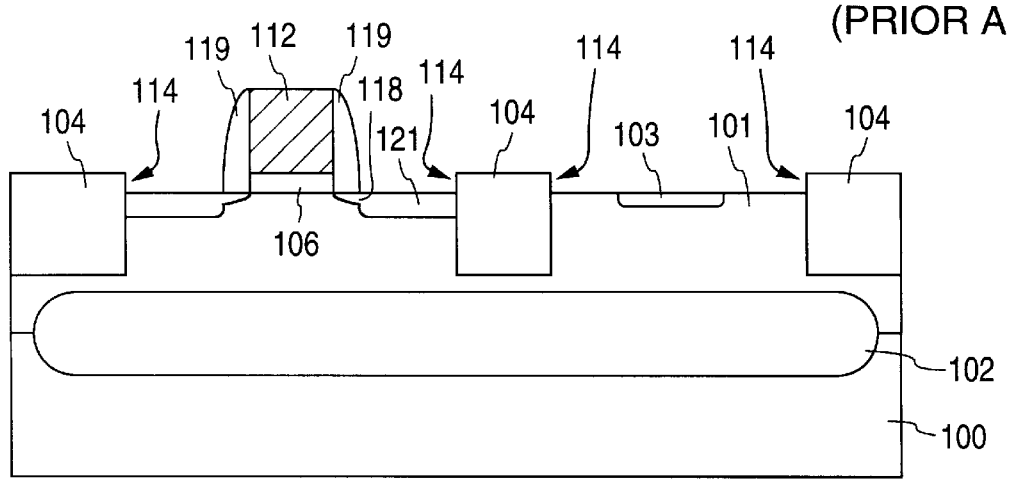
Figure 2A:
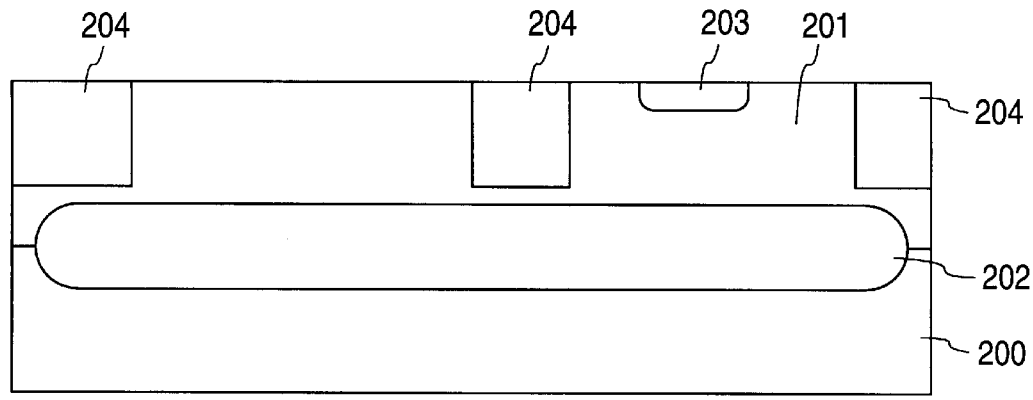
FIGS. 2A–2J illustrate cross-sectional views of the process steps for forming an NPN bipolar transistor having a polysilicon emitter in accordance with a first embodiment of the present invention.

FIG. 2A, identical to prior FIG. 1A, shows the starting point for the process. A high dose of N type dopant is implanted into silicon substrate 200 to create N+ region 202. Epitaxial silicon 201 is then grown from substrate 200 with adequate doping and thickness to meet the necessary collector requirements ($BV_{ceo}$, $BV_{cbo}$, etc.) of the particular device. Isolation structures 204 are formed using conventional techniques such as LOCOS or shallow trench. Finally, sink 203 enabling electrical contact with the collector is formed by implantation of a high dose of n type dopant at relatively low energy.

Figure 2B:
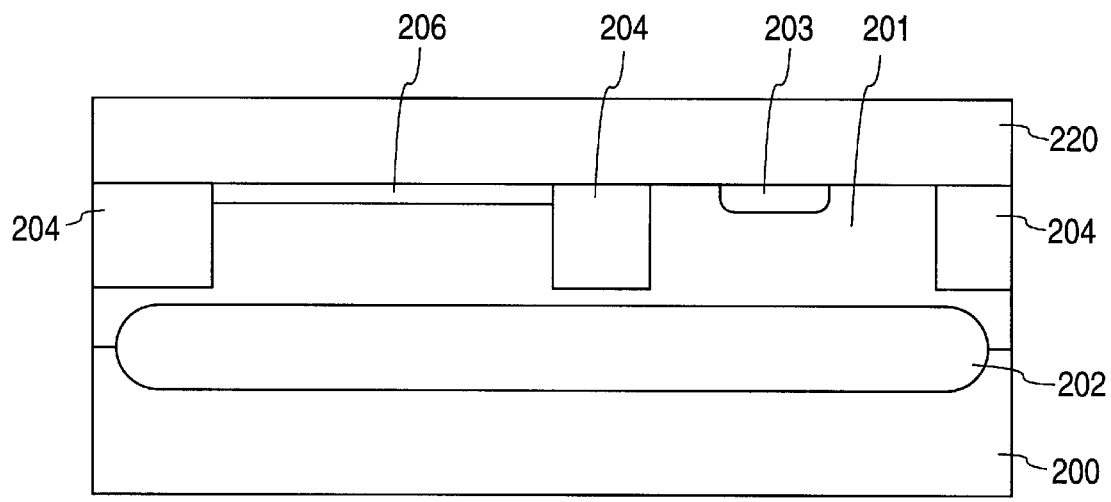

FIG. 2B shows implant of p type dopant into epitaxial silicon 201 to form intrinsic base 206, followed by deposition of a plasma or low temperature oxide film 220 over intrinsic base 206, sink 203, and isolation structures 204. Oxide film 220 is designed to have low density and a corresponding rapid etch rate in wet oxide etchants.

Figure 2C:
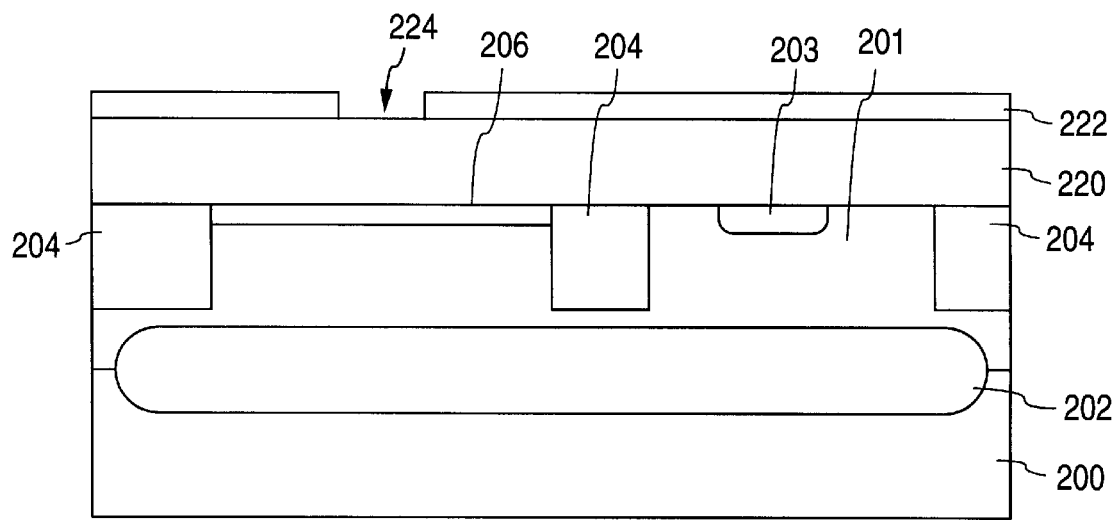
Figure 2D:
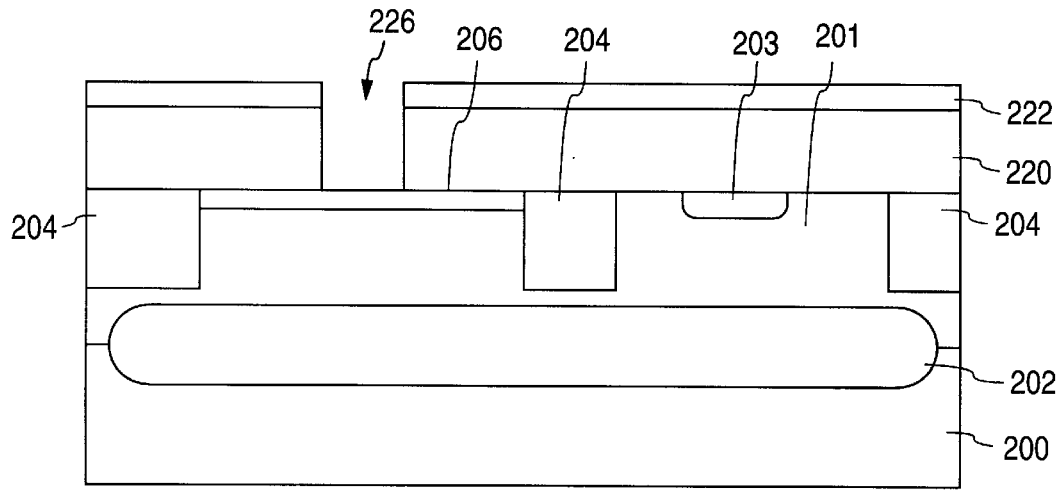

Next, FIG. 2C shows patterning of photoresist mask 222 over oxide film 220, leaving precursor window region 224 unmasked. FIG. 2D shows etching of precursor window region 224 to form window 226 using conventional masking and plasma etch techniques having good selectivity for oxide over silicon.

Figure 2E:
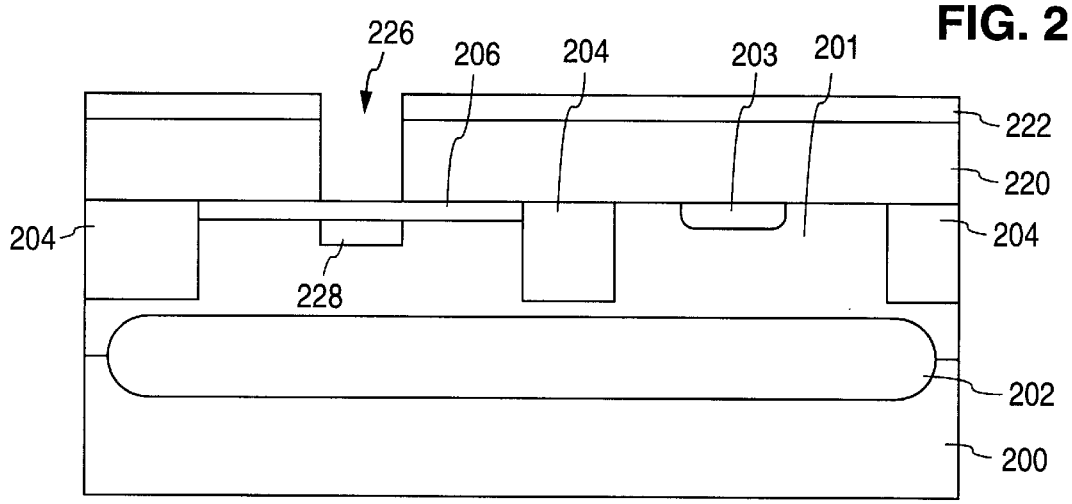

FIG. 2E shows formation of selectively implanted collector (SIC) structure 228 in epitaxial silicon directly underneath window 226. SIC structure 228 is self-aligned by window 226 in which the polysilicon emitter will subsequently be formed. SIC structure 228 is implanted through intrinsic base 206 at high energies (typically around 160 KeV) to create a slightly concentrated (approx. $1 \times 10^{13}$ atoms/cm$^3$) SIC region coextensive with the emitter to be formed within window 226. SIC structure 228 offers a lower parasitic capacitance between the emitter and collector than the conventional capacitor structure shown above in FIGS. 1A–1F.

Figure 2F:
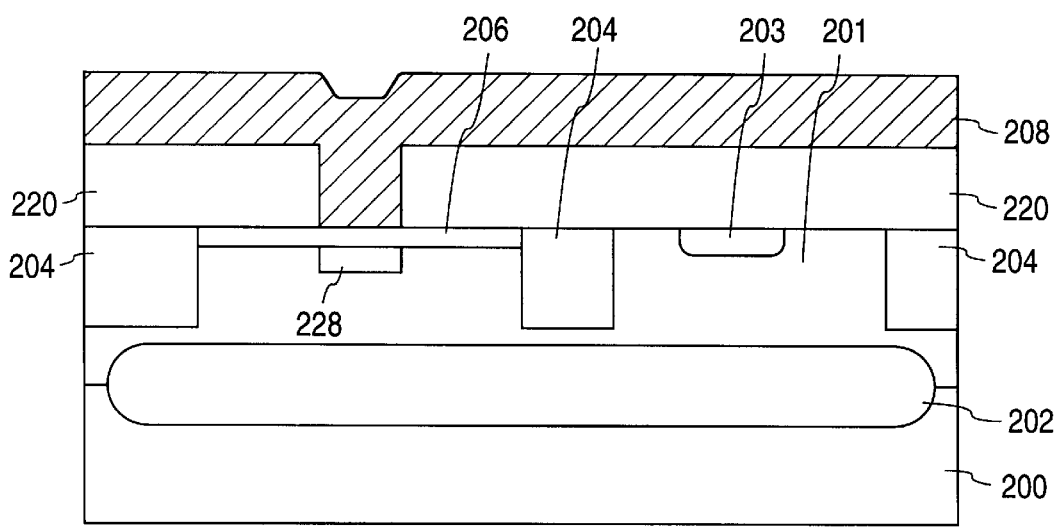
Figure 2G:
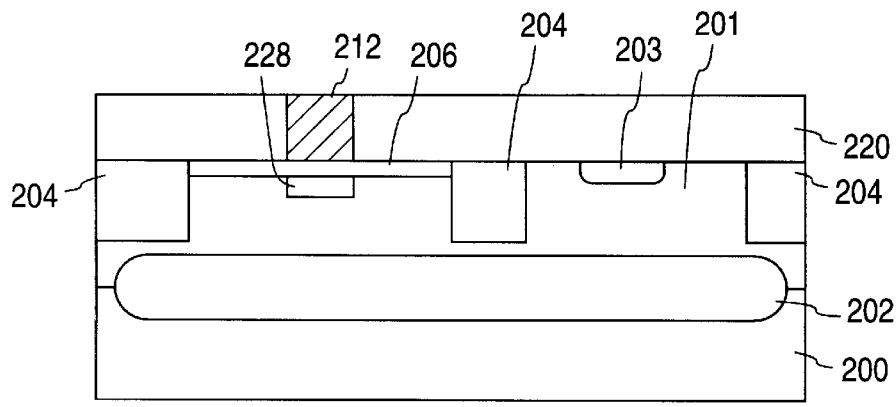

In FIG. 2F, photoresist layer 222 is stripped and layer of polysilicon 208 having n type dopant introduced in-situ is formed. FIG. 2G shows removal of excess polysilicon 208 outside of window 226 using CMP techniques, to form polysilicon emitter 212.

Figure 2H:
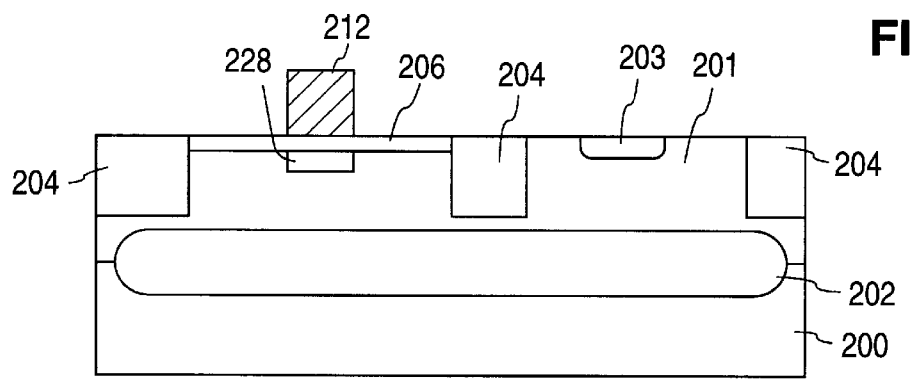

Oxide masking layer 220 is removed in the next step shown in FIG. 2H. Because a low density oxide film was originally used to form oxide mask 220, oxide mask 220 will etch rapidly in standard HF etchant solutions. Polysilicon emitter 212 formed in window 226 should experience little or no undercutting during this etching step because of the highly differential etch rate of low density oxide versus polysilicon.

Figure 2I:
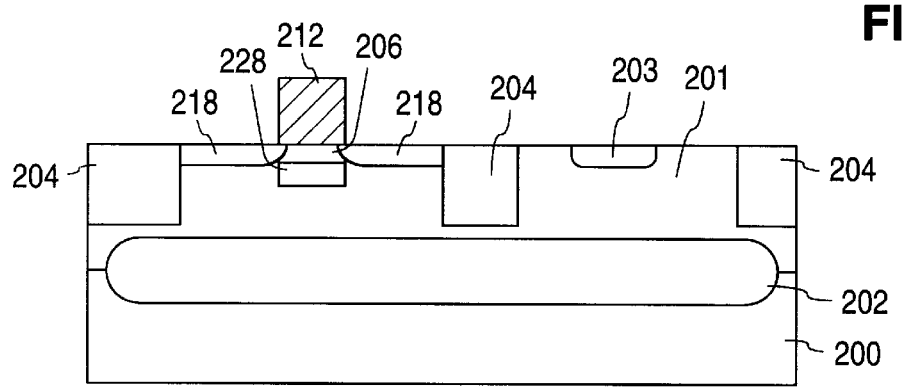

FIG. 2I shows implant of medium level doses (typically $1 \times 10^{18}$ atoms/cm$^3$) of p type dopant into epitaxial silicon adjacent to emitter 212, forming link base 218.

Figure 2J:
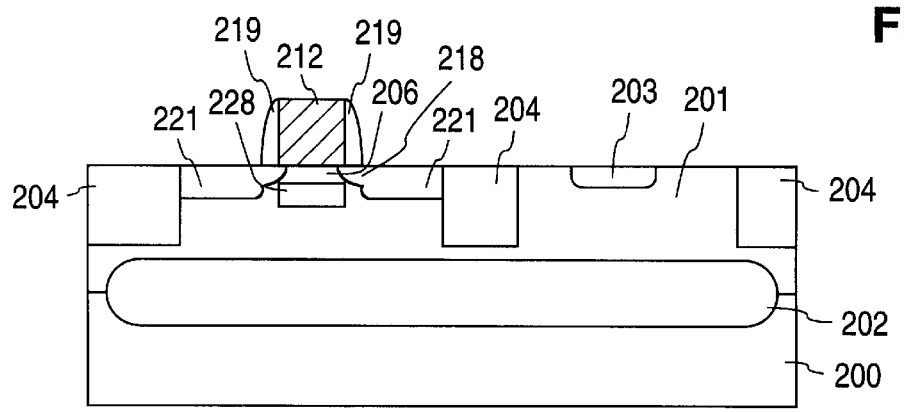

FIG. 2J shows the formation of emitter spacer structures 219, followed by the implant of high doses (typically $1 \times 10^{19} - 1 \times 10^{20}$ atoms/cm$^3$) of p type dopant into link base 218, forming extrinsic base 221.

Fabrication of the bipolar transistor 216 is finalized by creating silicided emitter, sink, and extrinsic base contacts, and an overlying interconnect metallization structure.

The process for forming a bipolar transistor having an extrinsic polysilicon emitter in accordance with the present invention offers a number of advantages over the conventional process. First, by adding only three noncritical steps (oxide deposition, CMP, photoresist strip) a self-aligned polysilicon emitter is formed without overetching of the intrinsic base commonly encountered in the conventional process.

A second advantage of the present invention is that poor electronic linkage between the intrinsic base and the link base is avoided, promoting lower base resistance. This is because the dimensions of the intrinsic base are not reduced by overetching, allowing for more substantial overlap between the intrinsic base and the link base.

A third advantage of the present invention is that the sink structure remains intact, and is not denuded by subsequent overetching of polysilicon formed above. In this manner, optimal electrical contact is maintained with the collector through the sink.

A fourth advantage of the present invention is that because no recesses are created in the intrinsic base, the implanted extrinsic and link bases are located at a shallow depth in the epitaxial silicon. This reduces the likelihood of leakage or breakdown occurring between the extrinsic and link base regions, and the underlying silicon.

A fifth advantage of the present invention is that a self-aligned SIC implant can readily be incorporated into the process without creating any additional masking steps. The is because the window formed in the oxide mask facilitates implantation to form the collector coextensive with the emitter above. SIC regions offer a bipolar transistor lower parasitic capacitance due to the reduced extent of the underlying capacitor. No corresponding opportunity for a self-aligned SIC implant exists in the conventional process flow, where the polysilicon is deposited and then removed to define the emitter.

A sixth advantage offered by the present invention is production of a relatively low number of defects. Specifically, virtually all of the polysilicon outside of the oxide mask window would be removed by the CMP step shown in FIG. 2G. Moreover, any polysilicon surviving this CMP step would be lifted off of the oxide during subsequent removal of the oxide mask as shown in FIG. 2H.

Although the invention has been described in connection with one preferred embodiment, it should be understood that the invention as claimed should not be unduly limited to this specific embodiment. Various other modifications and alterations in the method of this invention will be apparent to those skilled in the art without departing from the scope and spirit of the present invention.

For example, the method in accordance with the present invention could also be applied to fabricate a PNP bipolar transistor having a polysilicon emitter.

The present invention could also be employed in a CMOS technology, creating a BiCMOS process. The formation steps indicated above in FIGS. 2A–2J would follow patterning of the CMOS gate region. PLDD and link base implantations could be combined, as could source-drain and extrinsic base doping processes. Salicide would be applied to both MOS device types produced by the BiCMOS technology.

Moreover, the process in accordance with the present invention should not be limited to the specific steps depicted above in connection with FIGS. 2A–2J. Specifically, implantation of dopant to form the intrinsic base need not occur initially, but could be performed following etching of the oxide mask to form the window as shown in FIG. 2D. Furthermore, polysilicon formed outside of the window in the oxide mask could be removed by etching rather than by CMP, depending upon the specific application. Nor is it required that the polysilicon forming the emitter be doped in-situ. Implantation of dopant into the polysilicon emitter structure could occur as a separate step of the process. In addition, the oxide mask could be removed by plasma etching techniques, rather than wet etching.

Creation of a SIC structure utilizing a self-aligned implant is also not required by the present invention. Rather, lightly doped epitaxial silicon underlying the intrinsic base could form the collector, as described in the conventional process.

Therefore, it is intended that the following claims define the scope of the present invention, and that the methods and structures within the scope of these claims and their equivalents be covered hereby.

What is claimed is:

1. A method for forming a bipolar transistor having a polysilicon emitter comprising the steps of:
   forming an oxide layer over a silicon material;
   introducing a first dopant of a first conductivity type into the silicon material to form a collector;
   introducing a first dopant of a second conductivity type opposite the first conductivity type into the collector to form an intrinsic base;
   etching the oxide layer to form a window over the intrinsic base;
   forming polysilicon over the oxide layer and within the window;
   removing polysilicon outside of the window;
   introducing a second dopant of the first conductivity type into the polysilicon; and
   removing the oxide layer to reveal a polysilicon emitter structure over the intrinsic base.

2. The method according to claim 1 wherein the first and second dopant of the first conductivity type are the same.

3. The method according to claim 1 further comprising the step of:
   ion implanting a third dopant of the first conductivity type through the window prior to forming polysilicon to create a specially implanted collector region.

4. The method according to claim 3 wherein at least one of the first, second, and third dopant of the first conductivity type are the same.

5. The method according to claim 1 further comprising the steps of:
   ion implanting a second dopant of the second conductivity type into the intrinsic base aligned by the polysilicon emitter to form a link base;
   forming oxide spacers adjacent to the emitter; and
   ion implanting a third dopant of the second conductivity type into the link base aligned by the oxide spacers to form an extrinsic base.

6. The method according to claim 5 wherein at least one of the first, second, and third dopant of the second conductivity type are the same.

7. The method according to claim 1 wherein the step of introducing a first dopant of the second conductivity type to form the intrinsic base region includes ion implanting N type dopant.

8. The method according to claim 1 wherein the step of introducing a first dopant of the second conductivity type to form the intrinsic base region includes ion implanting P type dopant.

9. The method according to claim 1 wherein the step of introducing a second dopant of the first conductivity type to form the emitter includes ion implanting P type dopant.

10. The method according to claim 1 wherein the step of introducing a second dopant of the first conductivity type to form the emitter includes ion implanting N type dopant.

11. The method according to claim 1 wherein the step of introducing a second dopant of the first conductivity type into the polysilicon includes doping the polysilicon with P type dopant in situ.

12. The method according to claim 1 wherein the step of introducing a second dopant of the first conductivity type into the polysilicon includes doping the polysilicon with N type dopant in situ.

13. A method for forming a bipolar transistor having a polysilicon emitter comprising the steps of:
   forming an oxide layer over a silicon material;
   introducing a first dopant of a first conductivity type into the silicon material to form a collector;
   introducing a first dopant of a second conductivity type opposite the first conductivity type into the collector to form an intrinsic base;
   etching the oxide layer to form a window over the intrinsic base;
   forming polysilicon over the oxide layer and within the window;
   removing polysilicon outside of the window;
   introducing a second dopant of the first conductivity type into the polysilicon; and
   removing the oxide layer to reveal a polysilicon emitter structure over the intrinsic base; and
   ion implanting a second dopant of the second conductivity type into the intrinsic base aligned by the polysilicon emitter to form an extrinsic base.

14. The method according to claim 13 further comprising the steps of:
   ion implanting a third dopant of the second conductivity type into the intrinsic base aligned by the polysilicon emitter to form a link base;
   forming oxide spacers adjacent to the emitter; and
   ion implanting the second dopant of the second conductivity type into the link base aligned by the oxide spacers to form the extrinsic base.

15. The method according to claim 14 wherein at least one of the first, second, and third dopant of the first conductivity type are the same.

16. The method according to claim 14 wherein at least one of the first, second, and third dopant of the second conductivity type are the same.

* * * * *